United States Patent
deVilliers

(10) Patent No.: US 10,606,176 B2
(45) Date of Patent: *Mar. 31, 2020

(54) METHOD FOR PATTERNING A SUBSTRATE USING EXTREME ULTRAVIOLET LITHOGRAPHY

(71) Applicant: Tokyo Electron Limited, Minato-ku, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 4 days.

This patent is subject to a terminal disclaimer.

(21) Appl. No.: 15/271,306

(22) Filed: Sep. 21, 2016

(65) Prior Publication Data

US 2017/0090290 A1 Mar. 30, 2017

Related U.S. Application Data

(60) Provisional application No. 62/235,220, filed on Sep. 30, 2015.

(51) Int. Cl.
| | | |
|---|---|---|
| *G03F 7/20* | (2006.01) | |
| *G03F 7/16* | (2006.01) | |
| *H01L 21/027* | (2006.01) | |
| *H01L 21/308* | (2006.01) | |
| *G03F 7/00* | (2006.01) | |
| *G03F 7/26* | (2006.01) | |

(Continued)

(52) U.S. Cl.
CPC ............ *G03F 7/203* (2013.01); *G03F 7/0035* (2013.01); *G03F 7/16* (2013.01); *G03F 7/161* (2013.01); *G03F 7/2004* (2013.01); *G03F 7/2024* (2013.01); *G03F 7/2039* (2013.01); *G03F 7/26* (2013.01); *G03F 7/40* (2013.01); *H01L 21/0274* (2013.01); *H01L 21/3065* (2013.01); *H01L 21/3083* (2013.01); *H01L 21/3086* (2013.01); *H01L 21/30625* (2013.01)

(58) Field of Classification Search
CPC ........................................................ G03F 7/26
See application file for complete search history.

(56) References Cited

U.S. PATENT DOCUMENTS

| | | | |
|---|---|---|---|
| 5,667,940 A | 9/1997 | Hsue et al. | |
| 6,361,402 B1 * | 3/2002 | Canaperi | B24B 37/0056 257/E21.244 |

(Continued)

FOREIGN PATENT DOCUMENTS

JP 2000-56469 A 2/2000

OTHER PUBLICATIONS

International Search Report and Written Opinion dated Dec. 29, 2016 in PCT/US2016/052752 filed Sep. 21, 2016.

*Primary Examiner* — Kathleen Duda
(74) *Attorney, Agent, or Firm* — Oblon, McClelland, Maier & Neustadt, L.L.P.

(57) ABSTRACT

Techniques disclosed herein provide a method for continued patterning of substrates having sub-resolution features. Techniques include using novel deposition and removal techniques. This results in a substrate with inter-digitated photoresist in which photoresist is positioned between structures on a given substrate. Combined with using extreme ultraviolet lithographic exposure, patterning techniques herein can make desired cuts and blocks at specified locations on the substrate.

16 Claims, 3 Drawing Sheets

(51) Int. Cl.
*G03F 7/40* (2006.01)
*H01L 21/306* (2006.01)
*H01L 21/3065* (2006.01)

(56) References Cited

U.S. PATENT DOCUMENTS

| | | |
|---|---|---|
| 6,451,511 B1 | 9/2002 | Asanuma |
| 6,635,394 B2 | 10/2003 | Hung |
| 8,871,596 B2 | 10/2014 | Chen et al. |
| 8,987,070 B2 | 3/2015 | Cheng et al. |
| 2002/0090577 A1 | 7/2002 | Asanuma |
| 2002/0182515 A1 | 12/2002 | Hung |
| 2005/0042552 A1* | 2/2005 | Gau .................... G03F 7/2026 430/322 |
| 2012/0305994 A1* | 12/2012 | Merrett ............. H01L 29/66068 257/263 |
| 2014/0024191 A1 | 1/2014 | Chen et al. |
| 2014/0070357 A1 | 3/2014 | Cheng et al. |
| 2016/0343578 A1* | 11/2016 | Bencher ............. H01L 21/0274 |

* cited by examiner

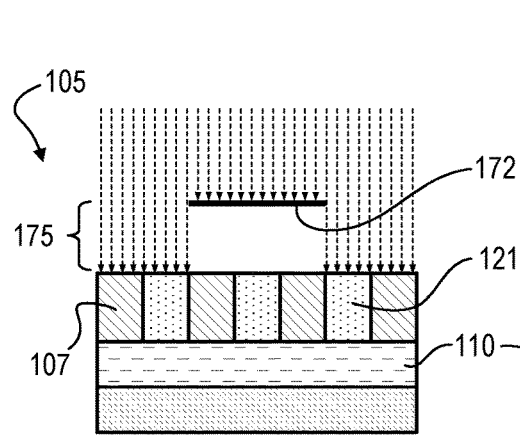
FIG. 4A
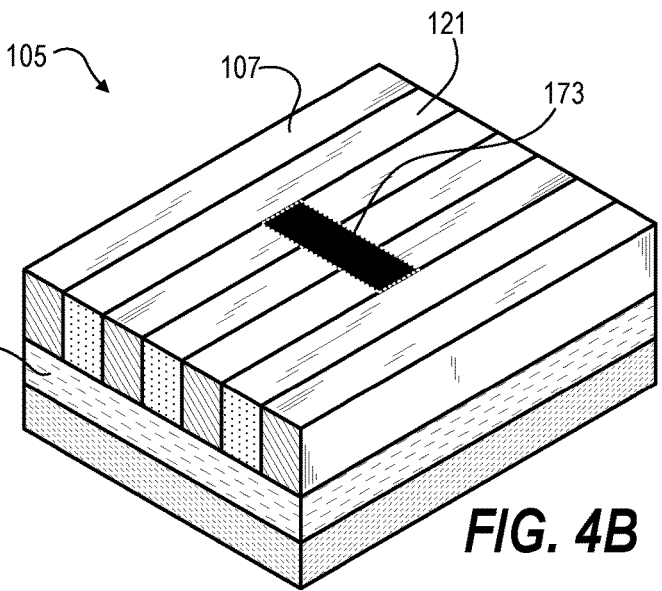
FIG. 4B
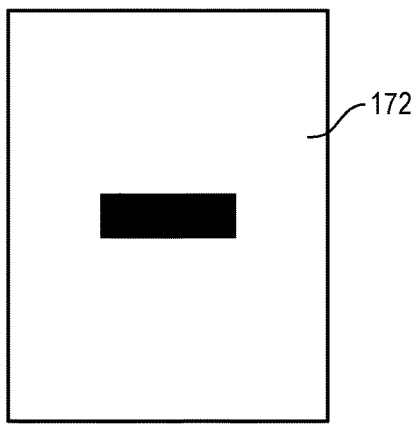
FIG. 5
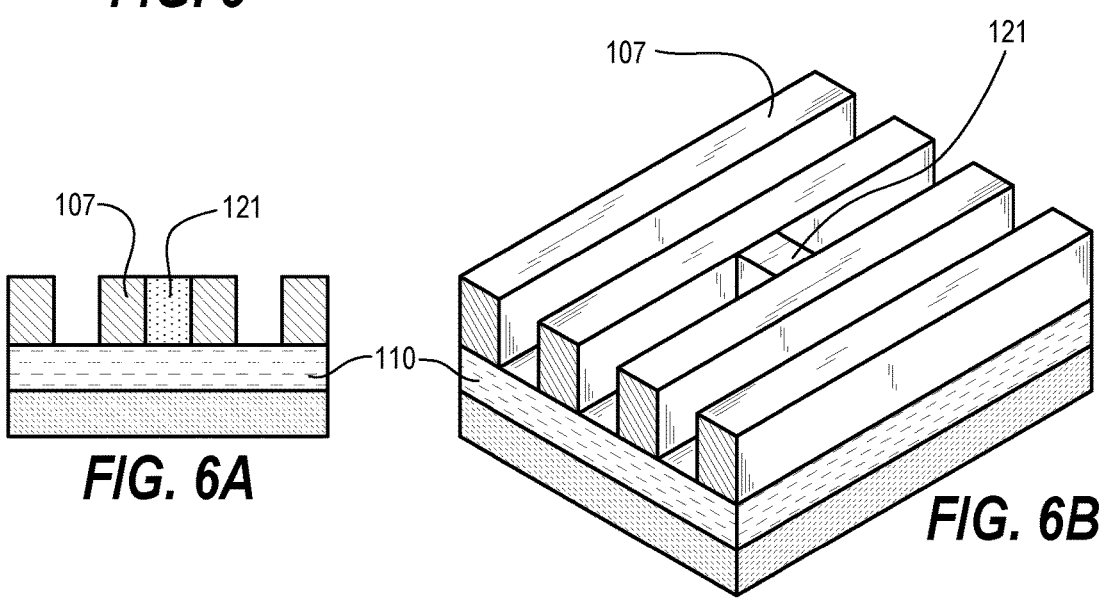
FIG. 6A
FIG. 6B

METHOD FOR PATTERNING A SUBSTRATE USING EXTREME ULTRAVIOLET LITHOGRAPHY

CROSS REFERENCE TO RELATED APPLICATIONS

The present application claims the benefit of U.S. Provisional Patent Application No. 62/235,220, filed on Sep. 30, 2015, entitled "Method for Patterning a Substrate Using Extreme Ultraviolet Lithography," which is incorporated herein by reference in its entirety.

BACKGROUND OF THE INVENTION

This disclosure relates to substrate processing, and, more particularly, to techniques for patterning substrates including patterning semiconductor wafers.

Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a relief pattern which can be used as an etch mask to transfer a pattern into an underlying layer on a substrate. Patterning of the radiation-sensitive material generally involves exposure of actinic radiation through a reticle (and associated optics) onto the radiation-sensitive material using, for example, a photo-lithography system. This exposure can then be followed by the removal of irradiated regions of the radiation-sensitive material or non-irradiated regions (depending on resist tone and developer tone) using a developing solvent. This mask layer can comprise multiple sub-layers.

Conventional photolithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional photolithographic techniques.

SUMMARY

Double patterning or multiple patterning can successfully produce sub-resolution features. For example, self-aligned double patterning (SADP) and self-aligned quadruple patterning (SAQP) can produce lines having a relatively small pitch. For example, with quadrupling a resultant "pitch quad" can be created with a 16 nanometer half pitch. Continued fabrication using a pitch quad or other sub-resolution pattern of structures is challenging. It is challenging for conventional photolithography to make cuts and make connections with features having such small critical dimensions.

Techniques disclosed herein provide a method for continued patterning of substrates having sub-resolution features. Techniques include using novel deposition and removal techniques. This results in a substrate with interdigitated photoresist in which photoresist is positioned between structures on a given substrate. Combined with using extreme ultraviolet lithographic exposure, patterning techniques herein can make desired cuts and blocks at specified locations on the substrate.

In one embodiment, a method of patterning a substrate includes receiving a substrate having a relief pattern. The relief pattern includes structures defining openings that have a width less than sufficient to enable wave propagation of electromagnetic radiation of wavelengths greater than 124 nanometers. The structures are comprised of material that is not sensitive to extreme ultraviolet radiation. A first photoresist is deposited on the substrate forming a first photoresist layer in which the first photoresist fills openings defined by the relief pattern. This also results in an overburden of first photoresist that extends from top surfaces of the relief pattern to a top surface of the first photoresist layer. A portion of the first photoresist layer is removed that includes removing the overburden of first photoresist such that first photoresist remains in openings defined by the relief pattern. The substrate is exposed to a first pattern of actinic radiation from an extreme ultraviolet lithography exposure system. Soluble portions of the first photoresist layer are developed using a predetermined developer.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIGS. 1A, 2A, 3A, 4A, 6A, and 7A are cross-sectional schematic side views of an example substrate segment showing a process flow according to embodiments disclosed herein.

FIGS. 1B, 2B, 3B, 4B, 6B, and 7B are cross-sectional schematic perspective views of an example substrate segment showing a process flow according to embodiments disclosed herein.

FIG. 5 is a top view of an example photomask pattern for fabrication.

DETAILED DESCRIPTION

Techniques disclosed herein provide a method for continued patterning of substrates having sub-resolution features. Techniques include using novel deposition and removal techniques. This results in a substrate with interdigitated photoresist in which photoresist is positioned between multiple structures on a given substrate. Combined with using extreme ultraviolet lithography (EUV), patterning techniques herein can make desired cuts and blocks at specified locations on pitch on the substrate.

For example, with techniques herein spin-on overcoat hardmasks can be integrated together with an EUV exposure which can then expose into and between features including pitch quad features. Currently, pitch multiplication techniques (such as pitch quad) can be used to create a pattern of lines and spaces. This pattern is sometimes referred to as a 1-dimensional pattern or feature. The challenge with using pitch quad patterning, however, is the inability to make cuts and blocks at desired dimensions with conventional techniques. Techniques herein disclose methods for creating cuts and blocks that enable EUV exposure, or can make use of EUV exposure. As such, EUV systems and exposure techniques can be used to make cuts and blocks for sub-resolution dimension patterns.

Figure 1A:
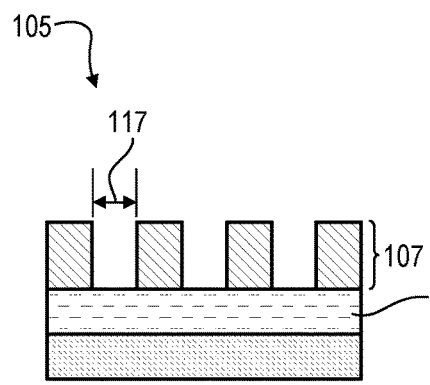
Figure 1B:
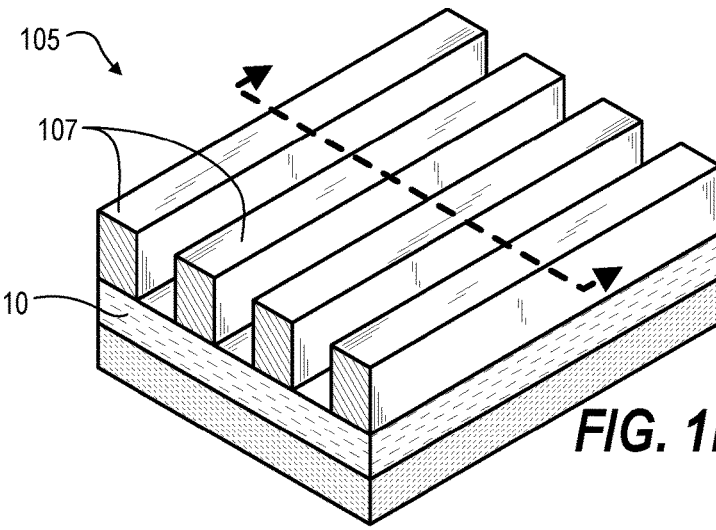

One example embodiment includes a method for patterning a substrate. Referring now to FIGS. 1A and 1B, a substrate 105 is received having a relief pattern 107 (topographic pattern). Relief pattern 107 is positioned on underlying layer 110. In some embodiments, the underlying layer 110 and any associated films do not include a bottom anti-reflective coating layer (BARC). In other words, in some embodiments, there is no BARC under the relief pattern 107. Note that Figure numbers that include the letter "A" show a cross-sectional view of a corresponding Figure number with a "B" letter. The relief pattern 107 includes structures defining openings that have a width less than sufficient to enable wave propagation of electromagnetic radiation of wavelengths greater than 124 nanometers. For example, dimension 117 shows an opening insufficient to enable light propagation of light wavelengths greater than 124 nanometers. In other words, the openings are too small for light greater than 124 nanometers to penetrate or propagate into the defined openings. By way of a non-limiting example, 193 nm light from a 193 nm photolithographic exposure system is unable to propagate into the defined openings because the openings are sized sufficiently small to create a classically forbidden space for this wavelength to propagate. In another embodiment, the width of defined openings in the relief pattern is sufficient to enable electromagnetic wave propagation of wavelengths between 7 nanometers and 40 nanometers. In other embodiments, the relief pattern 107 includes structures defining openings that have a width between 4 and 40 nanometers, and/or between 5 and 20 nanometers.

The structures of relief pattern 107 (such as lines) are comprised of material that is not sensitive to extreme ultraviolet radiation. In other words, the structures of the relief pattern 107 cannot receive a solubility shift from exposure to EUV radiation. One example material can include Titanium-nitride or other inorganic material. The relief pattern and structures thereon can be created from any number of fabrication techniques including mandrel formation, spacer deposition, sidewall image transfer, etc. For example, an array of lines can be formed using a self-aligned feature multiplication technique including quadrupling a given starting pitch density or feature density relative to an initial pitch or initial feature density. A combination of semiconductor manufacturing equipment can be used to create the relief pattern 107 including photolithographic scanners, wafer coater/developers, etch systems, cleaning tools, and so forth.

Figure 2A:
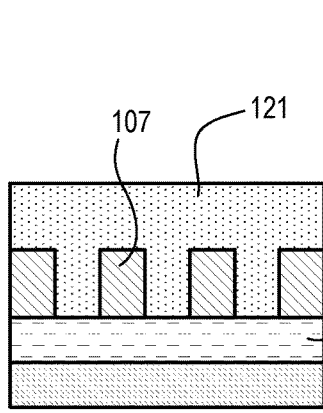
Figure 2B:
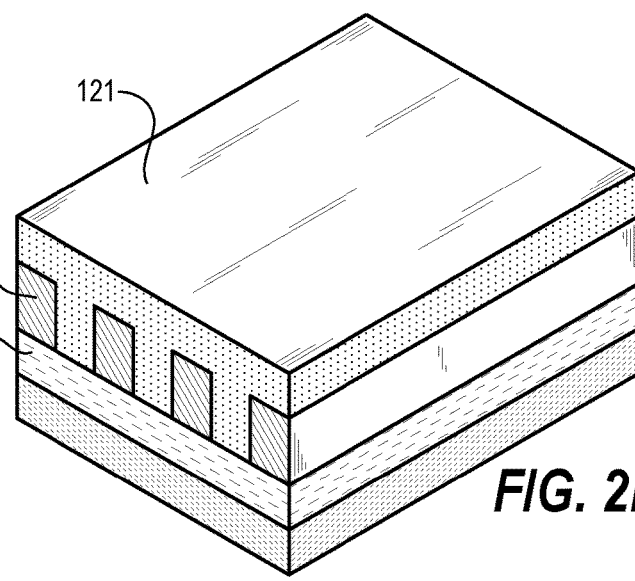

A first photoresist is deposited on the substrate. Such deposition can be executed by spin-on deposition of liquid photoresist. This deposition forms a first photoresist layer 121 in which the first photoresist fills openings defined by the relief pattern 107. Forming the first photoresist layer 121 results in an overburden of first photoresist extending from top surfaces of the relief pattern 107 to a top surface of the first photoresist layer. Dimension 124 illustrates an example overburden portion of first photoresist layer 121. Note that forming the first photoresist layer 121 can involve any requisite or preferred processing steps such as baking the photoresist to remove various solvents, et cetera. FIGS. 2A and 2B show example results of this deposition step.

Figure 3A:
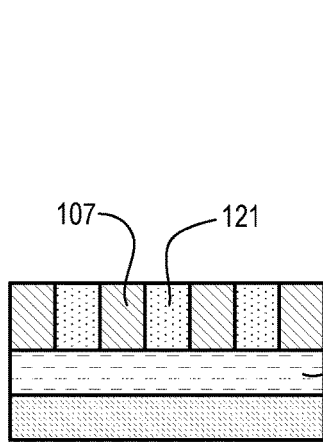
Figure 3B:
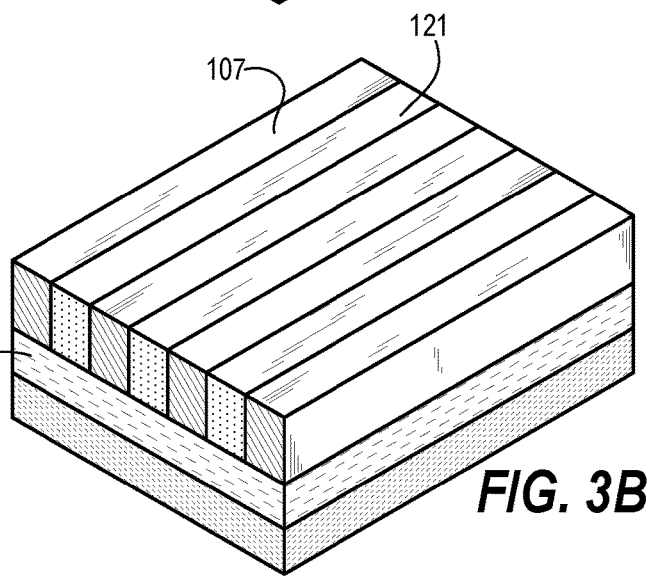

Next, a portion of the first photoresist layer 121 is removed that includes removing the overburden of first photoresist layer 121 such that the first photoresist remains in openings defined by the relief pattern 107. At this point, the substrate 105 is comprised of the relief pattern 107 having first photoresist layer 121 filling spaces between structures of the relief pattern 107, as illustrated in FIGS. 3A and 3B.

Various techniques can be used for removing the overburden of photoresist. For example, an etch back process that uses plasma-based etchants can be used to etch photoresist until uncovering top surfaces of the relief pattern. In another technique, an acid diffusion and development step can be executed that includes depositing an acid on the first photoresist layer and diffusing the acid a predetermined depth into the first photoresist layer. Such vertical diffusion can be accomplished by baking the substrate. Temperature and time parameters can accurately control an average diffusion depth and thus a depth of solubility shift. Developing chemicals can then be used to dissolve and remove the now soluble overburden. Vertical diffusion can also be location controlled by using a pixel-based projection system to activate more or less acid within selected areas of the substrate. Another technique can include executing a chemical mechanical polishing process or other physical removal of the overburden. With any selected type of overburden removal process, the photoresist can be recessed below top surfaces of the relief pattern 107.

The deposition and overburden removal steps thus result in a substrate having photoresist in between features (such as lines) that are too small for light wavelengths greater than 124 nanometers to propagate. Having the substrate essentially planarized (overburden removed) or even with photoresist recessed below the relief pattern 107 is beneficial to prevent any notching risk during exposure.

The substrate 105 is then exposed to a first pattern of actinic radiation 175, from an extreme ultraviolet lithography exposure system. FIG. 4A shows a photomask 172 blocking EUV radiation from reaching a portion of the substrate. This corresponds to shadowed region 173 as illustrated in FIG. 4B. FIG. 5 depicts a top view of photomask 172. A given EUV photomask essentially demarcates a region or regions on the substrate to keep or remove. In the particular example in FIG. 4B, a relatively small portion of the first photoresist between lines is desired to be kept, while the remaining photoresist is removed. Wherein exposing the substrate to the first pattern of actinic radiation includes the first pattern of actinic radiation defining a cut or a block.

EUV lithography systems are conventionally available, and typically use EUV radiation that is 13 nanometers in wavelength. Photolithographic exposure with EUV can shift a solubility of photoresist between lines because the 13 nm wavelength of EUV (or other wavelength) is small enough to propagate between the sub-resolution lines. In other words, EUV radiation has a wavelength sufficiently small to get between the lines. Thus, the material between the lines can be photoresist and have a solubility shift (from insoluble to soluble, or from soluble to insoluble). This is beneficial because typically it is not possible to expose photoresist where there is no bottom antireflective coating. But techniques herein can create solubility shifts in photoresist material between relatively small lines without an underlying BARC layer.

Such actinic radiation exposure between lines in not possible with conventional, non-EUV lithography because only EUV can tunnel through this classically forbidden region. Ordinarily this region is to tight or small for any light to fit through. Using EUV, however, it is possible to image the inter-digitated photoresist within a pitch quad or other pitch multiplied pattern. For example, with 16 nm spaces, it is not possible to image with 193 nm photo lithography, but with 13 nm wavelength radiation imaging happens in these small openings.

Note that various resist tones and developer tones can be used with techniques herein. If a selected photoresist tone is negative, then a positive developer can be used. With such a combination, using a dark field photomask will result in a block, while using a clear field photomask will result in a cut. If a selected photoresist tone is positive, then a negative developer can be used. With such a positive tone negative developer combination, using a dark field photomask will result in a block, while using a clear field photomask will result in a cut. Accordingly, various chemistry and patterning options are available as can be appreciated by those skilled in the art.

Photolithography that uses light wavelengths of 157 nm and greater benefits from using an anti-reflective coating, which is typically deposited underneath a photoresist layer. Such anti-reflective coatings function to prevent image distortions from reflections off of surfaces. Those versed in the art will appreciate that anti-reflective coatings in the context of EUV are a false notion because EUV radiation (also known as soft x-rays) typically passes through materials known on earth and/or causes secondary electron scattering. Because the physics of EUV light are substantially different than light of 157 nm and above, extrapolating assumed knowledge of non-EUV lithography into EUV lithography results in misunderstood material needs. With proper photoresist tuning, a BARC is entirely not needed with EUV exposure. Optionally, a buried diffusion layer can be included. This diffusion layer—instead of providing anti-reflectivity or claimed secondary electron capture—merely contains chemical acid loading, such as a photo acid generator, to enhance imaging. The acid loading in this diffusion layer can provide a relatively small portion of acid to the photoresist layer to improve imaging.

After exposure to a first pattern of actinic radiation 175, soluble portions of the first photoresist layer are developed using a first predetermined developer. Typically, developing refers to depositing or applying a liquid developer that dissolves soluble portions of a photoresist, which dissolved photoresist can then be rinsed off of a substrate. Note that the soluble portions can be either portions exposed to actinic radiation or portions shadowed from actinic radiation depending on a particular photoresist tone and developer tone combination. FIGS. 6A and 6B show an example result after a development step. Not that all that is left of first photoresist layer 121 is a relatively small portion that connects two lines.

Figure 7A:
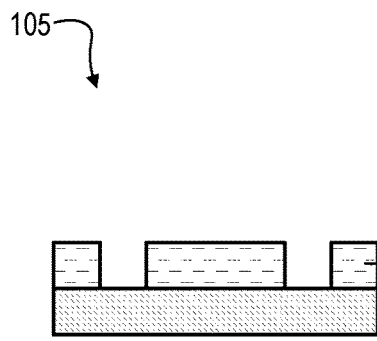
Figure 7B:
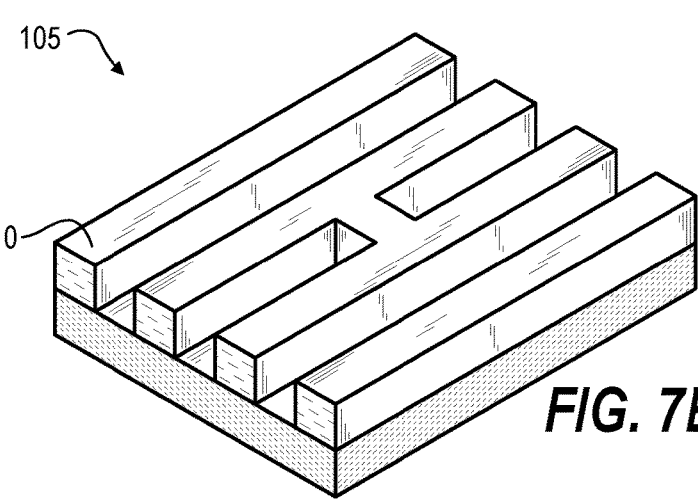

At this point additional patterning exposure can be executed, or pattern transfer can be executed. A first combined pattern is transferred into underlying layer 110. The first combined pattern is a combination of the relief pattern 107 and remaining portions of the first photoresist layer 121 after removing the overburden of first photoresist and after developing soluble portions of the first photoresist. FIGS. 7A and 7B show an example result after transferring this first combined pattern and removing relief pattern 107 and first photoresist layer 121. Underlying layer 110 now is a relief pattern based on the first combined pattern.

In other embodiments, a second photoresist is deposited on the substrate forming a second photoresist layer in which the second photoresist fills openings defined by the relief pattern and results in an overburden of second photoresist extending from top surfaces of the relief pattern to a top surface of the second photoresist layer. A portion of the second photoresist layer is removed that includes removing the overburden of second photoresist such that second photoresist remains in openings defined by the relief pattern. The substrate is exposed to a second pattern of actinic radiation from an extreme ultraviolet lithography exposure system. Soluble portions of the second photoresist are developed using a second predetermined developer. The first predetermined developer and the second predetermined developer can be different or identical.

After this second development step, a second combined pattern can be transferred into the underlying layer. The second combined pattern is a combination of the relief pattern and remaining portions of the second photoresist layer after removing the overburden of second photoresist and after developing soluble portions of the second photoresist layer. The underlying layer can thus function as a memorization layer.

Two or more exposures can be executed without using a memorization layer between exposures. After developing soluble portions of the first photoresist, remaining portions of first photoresist can be treated so that remaining portions of the first photoresist are no longer sensitive to extreme ultraviolet radiation. There are various chemical, thermal, and physical freeze treatments available. For example, the substrate can be treated with a flux of ballistic electrons using direct current superposition within an etch chamber.

Figure 8:
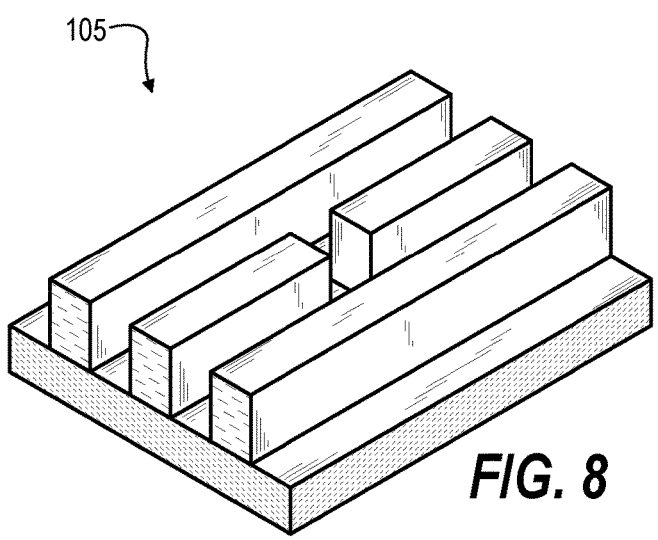
FIGS. 8 and 9 are cross-sectional schematic perspective views of an example substrate segment showing patterning results according to embodiments disclosed herein.
Figure 9:
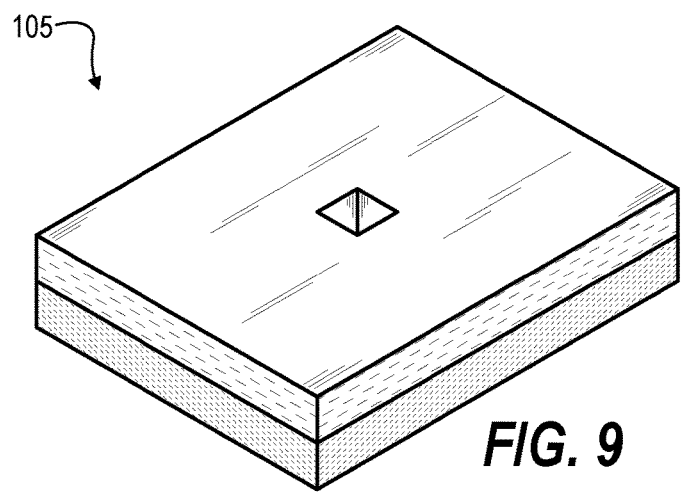

Using various combinations of cut masks, block masks, photoresist tones, developer tones, and memorization steps, any number of patterns can be created. FIGS. 8 and 9 show just a couple of example patterns that can be created with techniques herein. In other embodiments, for example, blocks can be recorded in a memorization layer with a first EUV exposure of inter-digitated resist. Then the substrate is over-coated with photoresist, which is then pulled down, and exposed with a second EUV mask to pattern cuts, which are then etch transferred into the memorization layer. The composite pattern in the memorization layer can then be used as an etch mask, or used with additional patterning operations. Thus, many conventionally desired yet inaccessible patterning operations are enabled with techniques herein.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
receiving a substrate having a relief pattern, the relief pattern including structures defining openings that have a width less than sufficient to enable wave propagation of electromagnetic radiation of wavelengths greater than 124 nanometers, the structures comprised of material that is not sensitive to extreme ultraviolet radiation;
depositing a first photoresist on the substrate forming a first photoresist layer in which the first photoresist fills openings defined by the relief pattern and results in an overburden of the first photoresist extending from top surfaces of the relief pattern to a top surface of the first photoresist layer;
removing a portion of the first photoresist layer that includes removing the overburden of the first photoresist such that the first photoresist remains in openings defined by the relief pattern;
after removing the overburden of the first photoresist, exposing the substrate to a first pattern of actinic radiation from an extreme ultraviolet lithography exposure system, the first pattern of actinic radiation formed using a photomask such that (i) a first region of the first photoresist layer covered by the photomask is not exposed to the actinic radiation, and (ii) a second region of the first photoresist layer are not covered by the photomask is exposed to the actinic radiation;
after exposing the substrate to the first pattern of actinic radiation, developing soluble portions of the first photoresist layer using a first predetermined developer such that the soluble portions in the second region of the first photoresist layer are removed resulting in a first combined pattern being a combination of the relief pattern and the first region of the first photoresist layer;
after developing soluble portions of the first photoresist layer, treating the first region of the first photoresist layer so that the first region of the first photoresist layer is no longer sensitive to extreme ultraviolet radiation; and
transferring the first combined pattern into an underlying layer.

2. The method of claim 1, further comprising:
depositing a second photoresist on the substrate forming a second photoresist layer in which the second photoresist fills openings defined by the first combined pattern and results in an overburden of second photoresist extending from top surfaces of the first combined pattern to a top surface of the second photoresist layer;
removing a portion of the second photoresist layer that includes removing the overburden of second photoresist such that the second photoresist remains in openings defined by the first combined pattern;
exposing the substrate to a second pattern of actinic radiation from an extreme ultraviolet lithography exposure system; and
developing soluble portions of the second photoresist using a second predetermined developer.

3. The method of claim 2, further comprising:
transferring a second combined pattern into the underlying layer, the second combined pattern being a combination of the first combined pattern and remaining portions of the second photoresist layer after removing the overburden of second photoresist and after developing soluble portions of the second photoresist layer.

4. The method of claim 1, wherein receiving the substrate includes receiving the substrate in which the relief pattern includes an array of lines formed using a self-aligned feature multiplication technique.

5. The method of claim 4, wherein the self-aligned feature multiplication technique includes quadrupling an initial feature density.

6. The method of claim 1, wherein removing the overburden of first photoresist includes executing an etch back process that uses plasma-based etchants.

7. The method of claim 1, wherein removing the overburden of first photoresist includes executing an acid diffusion and development step that includes depositing an acid on the first photoresist layer and diffusing the acid a predetermined depth into the first photoresist layer.

8. The method of claim 1, wherein removing the overburden of first photoresist includes executing a chemical mechanical polishing process.

9. The method of claim 1, wherein removing the overburden of first photoresist includes recessing the first photoresist below top surfaces of the relief pattern.

10. The method of claim 1, wherein receiving the substrate includes receiving the substrate that includes no bottom anti-reflective coating layer (BARC).

11. The method of claim 1, wherein receiving the substrate includes receiving the substrate in which the width of defined openings in the relief pattern is sufficient to enable electromagnetic wave propagation of wavelengths between 7 nanometers and 40 nanometers.

12. The method of claim 1, wherein exposing the substrate to the first pattern of actinic radiation includes the first pattern of actinic radiation defining a cut or a block.

13. A method of patterning a substrate, the method comprising:
receiving a substrate having a relief pattern, the relief pattern including structures defining openings that have a width between 4 and 40 nanometers, the structures comprised of material that is not sensitive to extreme ultraviolet radiation;
depositing a first photoresist on the substrate forming a first photoresist layer in which the first photoresist fills openings defined by the relief pattern and results in an overburden of first photoresist extending from top surfaces of the relief pattern to a top surface of the first photoresist layer;
removing a portion of the first photoresist layer that includes removing the overburden of first photoresist such that the first photoresist remains in openings defined by the relief pattern;
after removing the overburden of the first photoresist, exposing the substrate to a first pattern of actinic radiation from an extreme ultraviolet lithography exposure system, the first pattern of actinic radiation formed using a photomask such that (i) a first region of the first photoresist layer covered by the photomask is not exposed to the actinic radiation, and (ii) a second region of the first photoresist layer are not covered by the photomask is exposed to the actinic radiation;
after exposing the substrate to the first pattern of actinic radiation, developing soluble portions of the first photoresist layer using a first predetermined developer such that the soluble portions in the second region of the first photoresist layer are removed resulting in a first combined pattern being a combination of the relief pattern and the first region of the first photoresist layer;
after developing soluble portions of the first photoresist layer, treating the first region of the first photoresist layer so that the first region of the first photoresist layer is no longer sensitive to extreme ultraviolet radiation; and
transferring the first combined pattern into an underlying layer.

14. The method of claim 13, wherein the width openings defined by the relief pattern is between 5 nanometers and 20 nanometers.

15. The method of claim 13, further comprising:
depositing a second photoresist on the substrate forming a second photoresist layer in which the second photoresist fills openings defined by the first combined pattern and results in an overburden of second photoresist extending from top surfaces of the first combined pattern to a top surface of the second photoresist layer;
removing a portion of the second photoresist layer that includes removing the overburden of second photoresist such that the second photoresist remains in openings defined by the first combined pattern;
exposing the substrate to a second pattern of actinic radiation from an extreme ultraviolet lithography exposure system; and
developing soluble portions of the second photoresist using a second predetermined developer.

16. The method of claim 15, further comprising:
transferring a second combined pattern into the underlying layer, the second combined pattern being a combination of the first combined pattern and remaining portions of the second photoresist layer after removing the overburden of second photoresist and after developing soluble portions of the second photoresist layer.

* * * * *